(12) United States Patent
Yorozuya

(10) Patent No.: US 8,573,154 B2
(45) Date of Patent: Nov. 5, 2013

(54) PLASMA FILM FORMING APPARATUS

(75) Inventor: Shunichi Yorozuya, Utsunomiya (JP)

(73) Assignee: Honda Motor Co., Ltd., Tokyo (JP)

( * ) Notice: Subject to any disclaimer, the term of this patent is extended or adjusted under 35 U.S.C. 154(b) by 492 days.

(21) Appl. No.: 12/983,707

(22) Filed: Jan. 3, 2011

(65) Prior Publication Data

US 2011/0168094 A1     Jul. 14, 2011

(30) Foreign Application Priority Data

Jan. 13, 2010   (JP) ................................. 2010-005021

(51) Int. Cl.
| | |
|---|---|
| C23C 16/455 | (2006.01) |
| C23C 16/50 | (2006.01) |
| C23C 16/452 | (2006.01) |
| C23F 1/00 | (2006.01) |
| H01L 21/306 | (2006.01) |
| C23C 16/06 | (2006.01) |
| C23C 16/22 | (2006.01) |

(52) U.S. Cl.
USPC .................. 118/723 R; 118/718; 156/345.29; 156/345.31; 156/345.33; 156/345.37; 156/345.35

(58) Field of Classification Search
USPC ...................................... 118/719; 156/345.33
See application file for complete search history.

(56) References Cited

U.S. PATENT DOCUMENTS

| | | | | |
|---|---|---|---|---|
| 4,786,352 A | * | 11/1988 | Benzing | 156/345.48 |
| 4,834,020 A | * | 5/1989 | Bartholomew et al. | 118/719 |
| 4,996,077 A | * | 2/1991 | Moslehi et al. | 427/562 |
| 5,082,517 A | * | 1/1992 | Moslehi | 156/345.26 |
| 5,122,391 A | * | 6/1992 | Mayer | 427/126.3 |
| 5,136,975 A | * | 8/1992 | Bartholomew et al. | 118/715 |
| 5,413,671 A | * | 5/1995 | Ketchum | 216/37 |
| 5,688,359 A | * | 11/1997 | Martin | 156/345.19 |
| 5,938,851 A | * | 8/1999 | Moshtagh | 118/715 |
| 6,086,778 A | * | 7/2000 | Martin | 216/83 |
| 6,137,231 A | * | 10/2000 | Anders et al. | 315/111.21 |
| 6,143,080 A | * | 11/2000 | Bartholomew et al. | 118/718 |
| 6,206,973 B1 | * | 3/2001 | Bailey et al. | 118/718 |
| 6,220,286 B1 | * | 4/2001 | Davenport | 137/561 A |
| 6,245,396 B1 | * | 6/2001 | Nogami | 427/562 |
| 6,406,590 B1 | * | 6/2002 | Ebata et al. | 156/345.43 |
| 6,424,091 B1 | * | 7/2002 | Sawada et al. | 315/111.81 |
| 6,539,891 B1 | * | 4/2003 | Lee et al. | 118/723 E |
| 6,673,156 B2 | * | 1/2004 | Martin | 118/718 |
| 6,820,570 B2 | * | 11/2004 | Kilpela et al. | 118/723 R |
| 6,821,563 B2 | * | 11/2004 | Yudovsky | 427/248.1 |

(Continued)

FOREIGN PATENT DOCUMENTS

| | | |
|---|---|---|
| JP | 06-002149 A | 1/1994 |
| JP | 2003-173899 A | 6/2003 |
| JP | 2004-510571 A | 4/2004 |
| JP | 2008-518109 A | 5/2008 |

Primary Examiner — Rudy Zervigon
(74) Attorney, Agent, or Firm — Arent Fox LLP

(57) ABSTRACT

The present invention relates to a plasma film forming apparatus. In the plasma film forming apparatus, a flow control jig is disposed between a plasma nozzle and a film formation region of a substrate. The flow control jig has a plasma supply path, a raw material supply path, a film formation joined path formed by combining the plasma supply path and the raw material supply path, an exhaust path for discharging a plasma discharge gas and an unreacted raw material transported from the film formation region, and a recovery path for returning the unreacted raw material in the exhaust path to the plasma supply path.

4 Claims, 2 Drawing Sheets

(56) References Cited

U.S. PATENT DOCUMENTS

| | | | |
|---|---|---|---|
| 6,869,641 B2* | 3/2005 | Schmitt | 427/248.1 |
| 6,918,988 B2* | 7/2005 | Martin | 156/345.2 |
| 7,138,336 B2* | 11/2006 | Lee et al. | 438/680 |
| 7,455,892 B2 | 11/2008 | Goodwin et al. | |
| 7,736,955 B2* | 6/2010 | Yamazaki et al. | 438/151 |
| 7,819,081 B2* | 10/2010 | Kawasaki et al. | 118/723 E |
| 7,858,453 B2* | 12/2010 | Yamazaki | 438/151 |
| 8,236,106 B2* | 8/2012 | Iizuka et al. | 118/715 |
| 8,282,735 B2* | 10/2012 | Choi et al. | 118/715 |
| 8,349,084 B2* | 1/2013 | Johnson et al. | 118/718 |
| 2002/0160125 A1* | 10/2002 | Johnson et al. | 427/569 |
| 2004/0065255 A1* | 4/2004 | Yang et al. | 118/715 |
| 2004/0067641 A1* | 4/2004 | Yudovsky | 438/680 |
| 2005/0016457 A1* | 1/2005 | Kawasaki et al. | 118/723 E |
| 2005/0208217 A1* | 9/2005 | Shinriki et al. | 427/248.1 |
| 2006/0137608 A1* | 6/2006 | Choi et al. | 118/715 |
| 2006/0234514 A1* | 10/2006 | Gianoulakis et al. | 438/758 |
| 2006/0249077 A1* | 11/2006 | Kim et al. | 118/723 MP |
| 2007/0026540 A1* | 2/2007 | Nooten et al. | 438/5 |
| 2007/0264508 A1 | 11/2007 | Gabelnick et al. | |
| 2008/0110399 A1* | 5/2008 | Park et al. | 118/715 |
| 2008/0241384 A1* | 10/2008 | Jeong et al. | 427/255.29 |
| 2009/0156015 A1* | 6/2009 | Park et al. | 438/758 |
| 2011/0168094 A1* | 7/2011 | Yorozuya | 118/723 R |
| 2011/0300309 A1* | 12/2011 | Yorozuya | 427/569 |
| 2012/0222620 A1* | 9/2012 | Yudovsky | 118/725 |
| 2012/0225191 A1* | 9/2012 | Yudovsky et al. | 427/58 |
| 2012/0225192 A1* | 9/2012 | Yudovsky et al. | 427/58 |
| 2012/0225193 A1* | 9/2012 | Yudovsky | 427/58 |
| 2012/0225194 A1* | 9/2012 | Yudovsky | 427/58 |
| 2012/0225195 A1* | 9/2012 | Yudovsky | 427/58 |
| 2012/0225203 A1* | 9/2012 | Yudovsky | 427/248.1 |
| 2012/0225207 A1* | 9/2012 | Yudovsky | 427/255.5 |
| 2012/0225219 A1* | 9/2012 | Yudovsky | 427/595 |
| 2012/0269967 A1* | 10/2012 | Yudovsky et al. | 427/255.26 |
| 2013/0164445 A1* | 6/2013 | Kwong et al. | 427/255.5 |

* cited by examiner

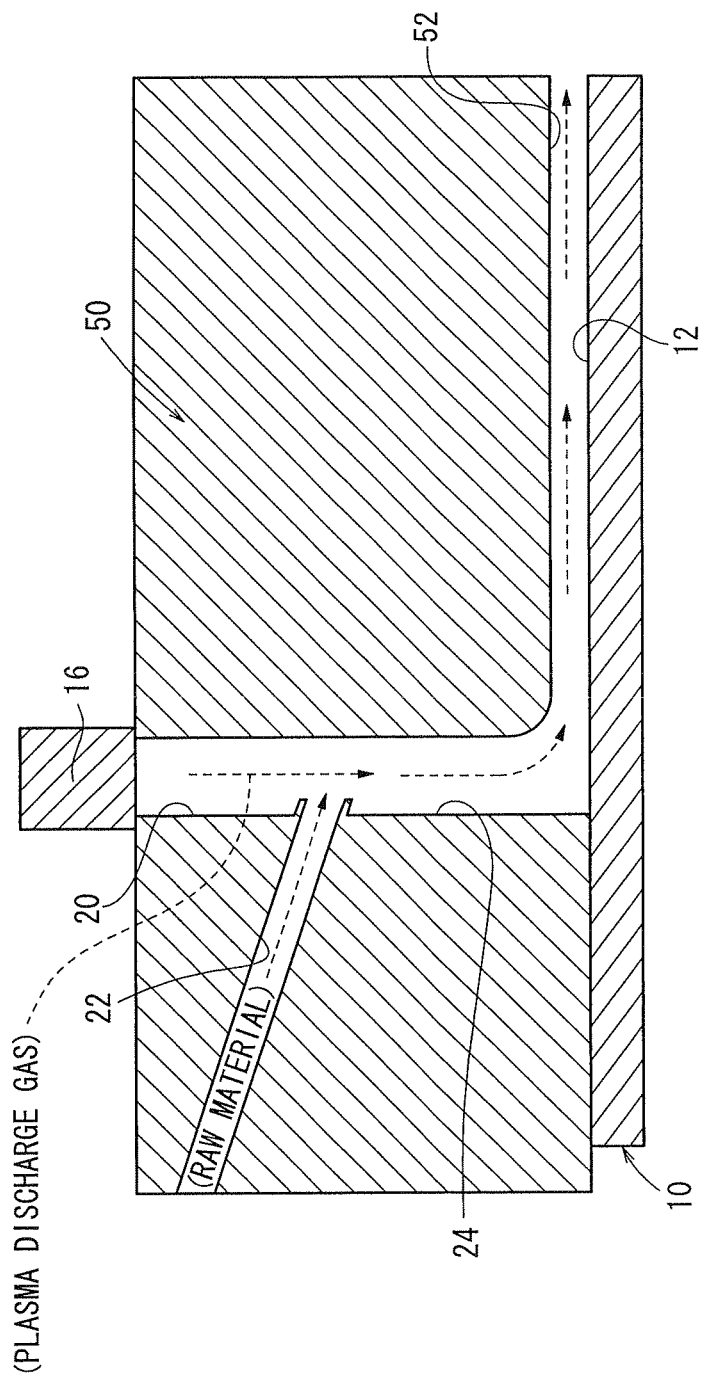

PLASMA FILM FORMING APPARATUS

CROSS-REFERENCE TO RELATED APPLICATION

This application is based upon and claims the benefit of priority from Japanese Patent Application No. 2010-005021 filed on Jan. 13, 2010, of which the contents are incorporated herein by reference.

BACKGROUND OF THE INVENTION

1. Field of the Invention

The present invention relates to a plasma film forming apparatus for activating a raw material for a film, thereby depositing the material to form a film on a surface of a substrate.

2. Description of the Related Art

Films such as protective films and functional films have been widely used on a surface of a substrate composed of a plastic, metal, or ceramic. One known method for forming such films (i.e. film formation) is a plasma film forming method using a plasma.

The plasma film forming method is generally carried out in a plasma film forming apparatus having a chamber equipped with a high-vacuum pump or the like. Thus, a substrate is placed in the chamber, the chamber is evacuated by the high-vacuum pump, a plasma is generated in the extremely low pressure atmosphere, and a raw material for a film is activated by the plasma. As a result, a substance derived from the film raw material is deposited on the substrate, whereby a film is formed on a surface of the substrate.

However, in this case, the high-vacuum pump per se is expensive. In addition, the chamber has to be pressure resistant, so that also the chamber becomes expensive. Therefore, the conventional plasma film forming method is clearly disadvantageous in high equipment cost. Furthermore, the film formation subject is limited to a substrate that can be contained in a chamber.

In view of this problem, a plasma apparatus capable of the plasma film formation under an atmospheric pressure has been proposed in Japanese Laid-Open Patent Publication No. 06-002149. This apparatus is advantageous in low equipment cost because a high-vacuum pump is not needed and the chamber does not have to be pressure resistant. Furthermore, there are no limitations on the shape and size of a substrate for the apparatus.

However, the apparatus is disadvantageous in that an impurity such as air is mixed in a generated plasma discharge gas, whereby the resultant film contains a large amount of the impurity. Therefore, the film has low quality and hardly exhibits the desired function.

This problem may be solved by forming a continuous flow of a plasma discharge gas and a raw material gas toward a film formation region on a surface of a substrate as proposed in Japanese Laid-Open Patent Publication No. 2003-173899. In this case, the flow of the plasma discharge gas and the raw material gas is blocked from an impurity such as air. Thus, the plasma discharge gas and the raw material gas are prevented from mixing with the impurity by a so-called block function. The resultant film can have high quality and exhibit satisfactorily desired function.

In the conventional technology described in Japanese Laid-Open Patent Publication No. 2003-173899, the plasma discharge gas and the raw material gas are each supplied from a separate supply source to the film formation region of the substrate in a direction, and the plasma discharge gas and the unreacted raw material gas transported from the film formation region is discharged in a different direction, so that the continuous flow is formed. It is clear from the above that the unreacted raw material gas is discharged to the outside together with the plasma discharge gas in the conventional technology.

Thus, in the technology, the raw material gas is used in an amount greatly exceeding the minimum amount required to form the film, resulting in high material cost.

SUMMARY OF THE INVENTION

A general object of the present invention is to provide a plasma film forming apparatus capable of efficiently using a film raw material.

A principal object of the present invention is to provide a plasma film forming apparatus capable of material cost reduction and resource saving.

Another object of the present invention is to provide a plasma film forming apparatus capable of forming a film without limitations on the size and shape of a substrate.

According to an aspect of the present invention, there is provided a plasma film forming apparatus for forming a film on a surface of a substrate using a film raw material activated by a plasma discharge gas, comprising
 a plasma nozzle for ejecting the plasma discharge gas and
 a flow control jig that is disposed between the plasma nozzle and the substrate to cover a film formation region on the surface of the substrate,
 wherein the flow control jig contains:
 a plasma supply path for transporting the plasma discharge gas ejected from the plasma nozzle to the film formation region,
 a raw material supply path that is connected to a film raw material supply source and joins the plasma supply path to mix the film raw material from the film raw material supply source with the plasma discharge gas,
 a film formation joined path that is formed by combining the plasma supply path and the raw material supply path to bring the mixture of the plasma discharge gas and the film raw material into contact with the film formation region,
 an exhaust path for discharging the plasma discharge gas and an unreacted residue of the film raw material transported from the film formation region, and
 a recovery path that is branched from the exhaust path and extends to the plasma supply path or the film formation joined path to return the unreacted residue of the film raw material in the exhaust path to the plasma supply path or the film formation joined path.

In this structure, the unreacted film raw material is returned from the exhaust path through the recovery path to the plasma supply path or the film formation joined path, and then reaches the film formation region. Thus, in the present invention, the unreacted film raw material can be efficiently recycled and resupplied to the film formation region. Therefore, the use efficiency of the film raw material is improved to facilitate the material cost reduction and resource saving.

This structure does not require a chamber for carrying out the plasma film formation and a high-vacuum pump for evacuating the chamber, and therefore does not need high equipment cost.

The film can be formed over an area larger than the film formation joined path by moving the flow control jig to the next film formation region. Furthermore, the film can be formed on the film formation region having various shapes by forming the film formation joined path corresponding to the shape. It is clear from the above that the film can be formed without limitations on the size and shape of the substrate in the present invention.

Accordingly, in the present invention, the film can be formed at low cost on the film formation region with various sizes and shapes.

It is preferred that the above structure further comprises a cooling means for cooling and condensing the unreacted residue of the film raw material flowing through at least one of the exhaust path or the recovery path.

In this case, the unreacted film raw material transported from the film formation region to the exhaust path or the recovery path can be cooled and condensed into the liquid phase. Thus, by converting the unreacted film raw material to the liquid phase, the unreacted film raw material can be further efficiently collected.

The film raw material condensed into the liquid phase is returned through the recovery path to the plasma supply path or the film formation joined path as described above. The returned material is vaporized and activated by the contact with a fresh plasma discharge gas ejected from the plasma nozzle, and then is resupplied to the film formation region.

It is preferred that an impurity removing means is disposed in the recovery path. The condensed raw material may contain a particle or a viscous component composed of a polymer of the raw material in some cases. The particle or the viscous component in the raw material may increase the surface roughness of the film, but can be removed by the impurity removing means to obtain a small surface roughness.

The film raw material supplied from the film raw material supply source may be in the liquid phase at ambient temperature and pressure. In this case, the unreacted film raw material can be readily condensed. This is because the film raw material has a relatively high condensation point.

The film raw material can be readily condensed (collected), whereby the use efficiency of the film raw material can be improved to further facilitate the material cost reduction and resource saving.

The above and other objects features and advantages of the present invention will become more apparent from the following description when taken in conjunction with the accompanying drawings in which a preferred embodiment of the present invention is shown by way of illustrative example.

BRIEF DESCRIPTION OF THE DRAWINGS

FIG. 2 is a front cross-sectional view showing a principal part of a plasma film forming apparatus according to a comparative example using a jig without a recovery path.

DESCRIPTION OF THE PREFERRED EMBODIMENTS

Figure 1:
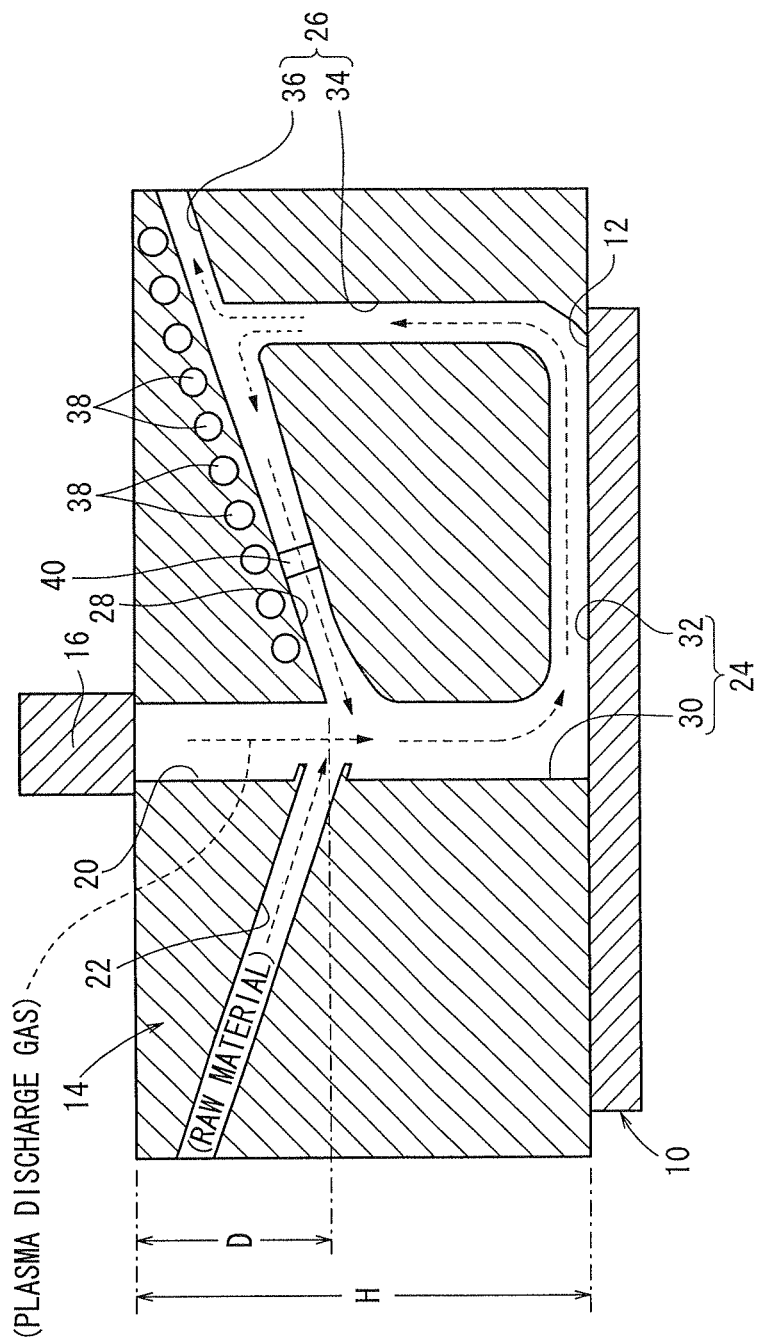
FIG. 1 is a front cross-sectional view showing a principal part of a plasma film forming apparatus according to an embodiment of the present invention.

A preferred embodiment of the plasma film forming apparatus of the present invention will be described in detail below with reference to the accompanying drawings.

FIG. 1 is a front cross-sectional view showing a principal part of a plasma film forming apparatus according to this embodiment. The plasma film forming apparatus is used for forming a film on a substrate 10, and has a flow control jig 14 for covering a film formation region 12 of the substrate 10 and a plasma nozzle 16 connected to the flow control jig 14. As is clear from FIG. 1, the flow control jig 14 is disposed between the substrate 10 and the plasma nozzle 16, and may have a height-direction size H of 10 mm.

In this embodiment, the substrate 10 (the film formation subject) is a plate having a flat top surface composed of a plastic, metal, ceramic, etc. The material for the substrate 10 may be a wood, a stone, etc. Preferred specific examples of the materials for the substrate 10 include polycarbonates.

The flow control jig 14 covering the film formation region 12 of the substrate 10 acts to form a flow for transporting a plasma discharge gas and a film raw material (hereinafter referred to simply as the raw material) to the film formation region 12 and for separating the plasma discharge gas and an unreacted residue of the raw material from the film formation region 12. Therefore, the flow control jig 14 has passages in which the plasma discharge gas and the raw material are flowed. Specifically, a plasma supply path 20, a raw material supply path 22, a film formation joined path 24 formed by combining the plasma supply path 20 and the raw material supply path 22, an exhaust path 26, and a recovery path 28 are formed in this order from the flow upstream in the flow control jig 14.

The plasma supply path 20 is connected to the plasma nozzle 16. Of course, the plasma nozzle 16 is connected to a plasma discharge gas generation mechanism (not shown) for generating the plasma discharge gas from an inert gas, so that the plasma discharge gas can be obtained (e.g. ejected) from the plasma nozzle 16. The plasma discharge gas generation mechanism is known in the art, and detailed explanations therefor are omitted.

The plasma supply path 20 is a passage for transporting the plasma discharge gas ejected from the plasma nozzle 16. In this embodiment, the plasma supply path 20 linearly extends from the top surface toward the bottom surface of the flow control jig 14 (i.e. in the vertical direction of FIG. 1).

The raw material supply path 22 is opened on the left surface of the flow control jig 14 shown in FIG. 1. The opening is connected to a supply pipe (not shown) by a pipe joint (not shown). Further, the supply pipe is connected to a raw material supply source (not shown) such as a liquid container or a gas canister. Obviously the raw material supply source contains the raw material to be deposited on the film formation region 12 to form the film.

In this embodiment, the raw material supply path 22 extends from the opening to the junction of the plasma supply path 20 obliquely downward at a small angle to the horizontal direction. Therefore, when the raw material is a liquid, it can be readily transported to the plasma supply path 20.

The end of the raw material supply path 22 is opened and protruded into the plasma supply path 20. Therefore, the raw material from the raw material supply path 22 joins the plasma discharge gas inside the plasma supply path 20. For example, the end of the raw material supply path 22 may be at a distance D of 1 mm from the end of the plasma nozzle 16.

The film formation joined path 24 is formed by combining the plasma supply path 20 and the raw material supply path 22 as described above. The film formation joined path 24 contains a vertical passage 30 extending in the vertical direction of FIG. 1 downstream of the plasma supply path 20 and a film formation passage 32 extending in the horizontal direction perpendicular to the vertical passage 30 facing the film formation region 12. The film formation passage 32 covers the entire film formation region 12.

The exhaust path 26 contains a rising passage 34 extending approximately vertically from the film formation passage 32 and an outward emission passage 36 extending from the rising passage 34 to an opening on the right surface of the flow control jig 14. Therefore, the outward emission passage 36 has an open end, from which the plasma discharge gas is discharged.

The rising passage 34 is branched into an approximately T shape, and one branched passage extending to the right surface of the flow control jig 14 shown in FIG. 1 is used as the outward emission passage 36. The other branched passage extending to the left surface is used as the recovery path 28.

Thus, the recovery path 28 is branched from the rising passage 34 in the exhaust path 26, and extends toward the left surface of the flow control jig 14 shown in FIG. 1. In this embodiment, the recovery path 28 joins the vertical passage 30 in the film formation joined path 24.

As described hereinafter, the unreacted residue of the raw material, transported from the film formation joined path 24 to the exhaust path 26, is introduced to the recovery path 28. Therefore, the unreacted raw material is resupplied through the film formation joined path 24 to the film formation region 12.

Cooling tubes 38 for channeling a cooling medium are arranged as a cooling means from the branch point of the rising passage 34 to the ends of the outward emission passage 36 and the recovery path 28. Therefore, the outward emission passage 36 connected to the rising passage 34, the vicinity of the branch point between the outward emission passage 36 and the recovery path 28, and the recovery path 28 are cooled by the cooling medium circulated in the cooling tubes 38. Thus, the raw material in the branch point and the recovery path 28 is cooled and then condensed.

In this embodiment, the exhaust path 26 and the recovery path 28 extend to the plasma supply path 20 (or the film formation joined path 24) obliquely downward at a small angle to the horizontal direction. Therefore, the raw material condensed in the exhaust path 26 or the recovery path 28 is readily transported toward the plasma supply path 20 (or the film formation joined path 24).

A filter 40 is disposed as an impurity removing means in an intermediate portion of the recovery path 28. When the condensed raw material contains a particle or a viscous component (a polymer of the raw material), the particle or the viscous component is removed by the filter 40.

The plasma film forming apparatus of this embodiment contains the flow control jig 14 having the above basic structure. The advantageous effects thereof will be described below in terms of the flow control jig 14. It should be noted that the raw material used in the following example is in the liquid phase at ambient temperature and pressure.

When the film is formed on the film formation region 12 of the substrate 10, first the plasma discharge gas is generated from the inert gas such as helium or argon by the plasma discharge gas generation mechanism, subjected to a drying treatment to remove water, and then ejected from the plasma nozzle 16.

Meanwhile, the raw material is supplied from the raw material supply source. The raw material is in the liquid phase at ambient temperature and pressure as described above, and specific examples thereof include hexamethyldisiloxane, cyclosiloxane, silsesquioxane, siloxanes having an Si—H bond, methanol, and low-molecular thiols. Alternatively, the raw material may be a substance described in Paragraph [0011] of Japanese Laid-Open Patent Publication No. 2004-510571 (PCT) or an organosilicon compound described in Paragraphs [0024] and [0025] of Japanese Laid-Open Patent Publication No. 2008-518109 (PCT).

The liquid-phase raw material may be bubbled with a carrier gas, so that the raw material may be transported to the flow control jig 14 together with the carrier gas. Alternatively, the liquid-phase raw material may be gasified by heating. Alternatively, the liquid-phase raw material may be introduced to the flow control jig 14 by using an appropriate transport mechanism such as a pump or an appropriate transport medium such as an ultrasonic wave.

The raw material transported from the raw material supply path 22 joins the plasma discharge gas transported from the plasma supply path 20 in the vertical passage 30 of the film formation joined path 24. The raw material is mixed with and activated by the plasma discharge gas. The above described raw material has a high vapor pressure, and thereby is readily vaporized. Thus, the raw material is efficiently gasified. The gasification is accelerated also by heat drawn from the plasma discharge gas. The raw material is converted to the gas phase in this manner.

The activated raw material then reaches the film formation passage 32 of the film formation joined path 24 together with the plasma discharge gas. The raw material is deposited on the film formation region 12 facing the film formation passage 32 to form a film of the material. For example, in the case of using the above siloxane as the raw material, the resultant film contains a polymer having Si—O bonds.

All of the raw material transported onto the film formation region 12 is not used in the film formation, and a part of the raw material passes through the film formation region 12 in the unreacted state. Therefore, the plasma discharge gas and the unreacted residue of the raw material are introduced to the rising passage 34 of the exhaust path 26.

The plasma discharge gas and the unreacted raw material move upward along the rising passage 34, and reach the branch point between the outward emission passage 36 and the recovery path 28. The plasma discharge gas (such as argon) has an extremely low condensation point, and thereby is not condensed at this point. Therefore, the plasma discharge gas is transported from the rising passage 34 to the outward emission passage 36 while maintaining the gas phase state, and is discharged from the right surface of the flow control jig 14 to the outside.

Particular problems are not caused even when a part of the plasma discharge gas is introduced to the recovery path 28, transported through the recovery path 28 to the film formation joined path 24 (the vertical passage 30), and mixed with a fresh plasma discharge gas from the plasma supply path 20 and a fresh raw material from the raw material supply path 22.

On the other hand, the unreacted raw material is condensed into the liquid phase since the branch point is cooled by the cooling medium. A substance capable of cooling the raw material to the condensing temperature may be selected as the cooling medium. For example, in the case of using the hexamethyldisiloxane as the raw material, the cooling medium may be a substance capable of cooling a portion of the recovery path 28 in the flow control jig 14 to −20° C. to 15° C. The cooling medium may be a liquid or a gas.

The condensed raw material may contain a solid phase such as the particle or the viscous component in some cases. The particle or the viscous component is collected by the filter 40 disposed in the intermediate portion of the recovery path 28. Therefore, the raw material containing only the liquid phase without the solid phase is eluted from the filter 40. In this case, the resultant film has a smooth surface with a small surface roughness.

The liquid-phase raw material eluted from the filter 40 is transported from the recovery path 28 to the vertical passage 30 of the film formation joined path 24. Then, in the vertical passage 30, the raw material is vaporized again into the gas phase due to its high volatility or the heat drawn from the plasma discharge gas. The raw material is activated by the plasma discharge gas at the same time, and then resupplied to the film formation region 12.

As described above, in this embodiment, the flow control jig 14 acts to form the flow for recycling and resupplying the unreacted raw material to the film formation region 12. Therefore, the unreacted raw material can be reused in the film formation. Furthermore, as is clear from above, the unreacted raw material is prevented from being transported to the outward emission passage 36, so that most of the unreacted raw material is condensed and recovered. Thus, the use efficiency of the raw material is significantly improved to facilitate material cost reduction and resource saving.

In addition, in this embodiment, a chamber for carrying out the plasma film formation and a high-vacuum pump for evacuating the chamber are not needed, thereby resulting in low equipment cost.

The film may be formed on another film formation region 12 by moving the flow control jig 14 to the other film formation region 12 such that the film formation passage 32 of the film formation joined path 24 faces the other film formation region 12. In this embodiment, a desired area of the substrate 10 can be coated with the film by repeating the film formation. Thus, the film can be formed without limitations on the size and shape of the substrate 10.

It is to be understood that the present invention is not limited to the above embodiment, and various changes and modifications may be made therein without departing from the scope of the present invention.

For example, though the raw material in the recovery path 28 is cooled by circulating the cooling medium in the cooling tubes 38 in the above embodiment, the cooling means is not limited thereto. The cooling means may have any structure as long as it can act to condense the raw material. Specifically, the cooling means may be a Peltier device.

It is not necessary to project the end of the raw material supply path 22 into the plasma supply path 20. The recovery path 28 may join the plasma supply path 20 upstream of the junction of the plasma supply path 20 and the raw material supply path 22.

Furthermore, the raw material may be a gas as long as it can be condensed.

In addition, the film formation joined path 24 and the exhaust path 26 are not limited to the above shapes shown in FIG. 1. For example, when the plasma discharge gas and the raw material are obliquely applied to the substrate 10, the film formation joined path 24 may be formed at an angle to the substrate 10. When the film formation region 12 of the substrate 10 has a curved surface, the film formation passage 32 may have a curved shape corresponding to the film formation region 12.

Example

Films were formed by using the plasma film forming apparatus containing the flow control jig 14 having a height H of 10 mm and a distance D of 1 mm shown in FIG. 1. The substrate 10 and the raw material were a polycarbonate substrate and hexamethyldisiloxane, respectively. The plasma discharge gas was obtained from an He/$O_2$ mixed gas having an He/$O_2$ volume ratio of 98/2 by a plasma generation apparatus manufactured by Plasma Concept Tokyo, Inc., and was ejected from the plasma nozzle 16 at a flow rate of 100 cm/second.

Meanwhile, a cooling water was circulated in the cooling tubes 38, and a cold trap was placed in the opening of the outward emission passage 36. The cold trap acted to cool the plasma discharge gas discharged from the opening of the outward emission passage 36, whereby the raw material contained therein was condensed (or solidified) and collected.

In the case of not using the filter 40 in the recovery path 28, the film formation rate was 1.2 μm/minute, and the weight of the raw material collected in the cold trap was 3 g/minute. The resultant film had a surface roughness of 0.25 μm.

In contrast, when the filter 40 was used in the recovery path 28, the resultant film had a surface roughness of 0.05 μm significantly smaller than that in the above case of not using the filter 40 though the film formation rate and the raw material weight in the cold trap per unit time were approximately equal to those in the above case. This was considered because a particle causing surface roughness increase was effectively removed by the filter 40.

In addition, a film was formed under the same conditions except that the cooling medium was not circulated in the cooling tubes 38 and that the filter 40 was not used. As a result, the film formation rate was 0.7 μm/minute, and the raw material weight in the cold trap was 6.1 g/minute. The film had a surface roughness of 0.15 μm.

For comparison, a film was formed by using a plasma film forming apparatus containing a jig 50 shown in FIG. 2. The same components are marked with the same reference signs in FIGS. 1 and 2.

In the jig 50, a path covering the film formation region 12 acts as the film formation passage and the exhaust path. This path is hereinafter referred to as the film formation/exhaust path 52.

As is clear from FIG. 2, in the jig 50, the plasma discharge gas from the plasma supply path 20 and the raw material from the raw material supply path 22 are mixed in the film formation joined path 24 and reach the film formation/exhaust path 52. A part of the raw material activated by the plasma discharge gas is used for forming a film on the film formation region 12, and the unreacted residue of the raw material is discharged outside of the film formation/exhaust path 52.

A film was formed on a polycarbonate substrate by using the jig 50 and the hexamethyldisiloxane activated by the plasma discharge gas obtained from the He/$O_2$ mixed gas having an He/$O_2$ volume ratio of 98/2 in the same manner as above. It is to be understood that the plasma discharge gas was ejected from the plasma nozzle 16 at a rate of 100 cm/second. As a result, the film formation rate was 0.3 μm/minute, less than ½ of those of the above examples using the recycled resupplied raw material. The weight of the raw material collected in the cold trap was 8.4 g/minute.

As is clear from the results, when the unreacted raw material was recovered and introduced to the film formation joined path 24 or the like, the film formation rate could be improved and the raw material could be efficiently recycled and resupplied. Incidentally, the film formed by using the jig 50 had a surface roughness of 0.15 μm.

Although certain preferred embodiments of the present invention have been shown and described in detail, it should be understood that various changes and modifications may be made therein without departing from the scope of the appended claims.

What is claimed is:

1. A plasma film forming apparatus for forming a film on a surface of a substrate using a film raw material activated by a plasma discharge gas, comprising
   a plasma nozzle for ejecting the plasma discharge gas and
   a flow control jig that is disposed between the plasma nozzle and the substrate to cover a film formation region on the surface of the substrate,
   wherein the flow control jig contains:

a plasma supply path for transporting the plasma discharge gas ejected from the plasma nozzle to the film formation region, a raw material supply path that is connected to a film raw material supply source and joins the plasma supply path to mix the film raw material from the film raw material supply source with the plasma discharge gas, a film formation joined path that is formed by combining the plasma supply path and the raw material supply path to bring the mixture of the plasma discharge gas and the film raw material into contact with the film formation region, an exhaust path for discharging the plasma discharge gas and an unreacted residue of the film raw material transported from the film formation region, and a recovery path that is branched from the exhaust path and extends to the plasma supply path or the film formation joined path to return the unreacted residue of the film raw material in the exhaust path to the plasma supply path or the film formation joined path.

2. The plasma film forming apparatus according to claim 1, further comprising a cooling means for cooling and condensing the unreacted residue of the film raw material in at least one of the exhaust path or the recovery path.

3. The plasma film forming apparatus according to claim 1, further comprising an impurity removing means in the recovery path.

4. The plasma film forming apparatus according to claim 1, wherein the film raw material supplied from the film raw material supply source is in a liquid phase at ambient temperature and pressure.

* * * * *